(12) United States Patent
Van Dalen et al.

(10) Patent No.: US 9,871,129 B2
(45) Date of Patent: Jan. 16, 2018

(54) THYRISTOR, A METHOD OF TRIGGERING A THYRISTOR, AND THYRISTOR CIRCUITS

(71) Applicant: Silergy Corp., Grand Cayman (KY)

(72) Inventors: Rob Van Dalen, Bergeijk (NL); Maarten Jacobus Swanenberg, Berg en Dal (NL); Inesz Emmerik-Weijland, Malden (NL)

(73) Assignee: Silergy Corp., Cayman Islands (GB)

( * ) Notice: Subject to any disclaimer, the term of this patent is extended or adjusted under 35 U.S.C. 154(b) by 0 days.

(21) Appl. No.: 14/279,497

(22) Filed: May 16, 2014

(65) Prior Publication Data

US 2014/0375377 A1    Dec. 25, 2014

(30) Foreign Application Priority Data

Jun. 24, 2013  (EP) ..................... 13173359

(51) Int. Cl.
| | | |
|---|---|---|
| *H01L 27/00* | (2006.01) | |
| *H01L 29/74* | (2006.01) | |
| *H01L 29/08* | (2006.01) | |
| *H01L 27/15* | (2006.01) | |
| *H03K 17/72* | (2006.01) | |

(52) U.S. Cl.
CPC ........ *H01L 29/7408* (2013.01); *H01L 27/153* (2013.01); *H01L 29/0839* (2013.01); *H01L 29/7412* (2013.01); *H01L 29/7428* (2013.01); *H03K 17/72* (2013.01)

(58) Field of Classification Search
CPC ............. H01L 29/0839; H01L 29/7408; H01L 29/7412; H01L 29/7428; H01L 27/153; H01L 29/0834; H03K 17/72
See application file for complete search history.

(56) References Cited

U.S. PATENT DOCUMENTS 3,566,211 A  *  2/1971  Per Svedberg ......... H01L 21/18
                                                     257/160
3,777,229 A     12/1973  Burtscher et al.
(Continued)

FOREIGN PATENT DOCUMENTS

EP    0287856   * 10/1988
WO   86/00469     1/1986

OTHER PUBLICATIONS

Baliga B. J. "Fundamentals of Power Semiconductor Devices, Chapter 8 Thyristors , 8.4 Switching Characteristics , 8.4.3 Amplifying Gate Design" , Springer-Verlag New York Inc., pp. 672-675 (2008).

(Continued)

*Primary Examiner* — Dale E Page
*Assistant Examiner* — Quovaunda V Jefferson

(57) ABSTRACT

A thyristor is disclosed comprising: a first region of a first conductivity type; a second region of a second conductivity type and adjoining the first region; a third region of the first conductivity type and adjoining the second region; a fourth region of the second conductivity type and comprising a first segment and a second segment separate from the first segment, the first segment and second segment each adjoining the third region; a first contact adjoining the first region; a second contact adjoining the first segment; and a trigger contact adjoining the second segment and separate from the second contact.

13 Claims, 5 Drawing Sheets

(56) References Cited

U.S. PATENT DOCUMENTS

| | | | | |
|---|---|---|---|---|
| 3,896,476 | A | * | 7/1975 | Kawakami ............ H01L 29/744 257/146 |
| 4,748,533 | A | * | 5/1988 | Hertrich ............. H01L 27/0705 257/E27.029 |
| 5,998,812 | A | | 12/1999 | Bernier et al. |
| 2009/0323238 | A1 | | 12/2009 | Gehrke |

OTHER PUBLICATIONS

Letavic, L. et al. "650V SOI LIGBT for Switch-Mode Power Supply Application", Proc. IEEE Int. Symp. on Power Sem. Dev. and IC's, 4 pgs. (Jun. 2006).

Swanenberg, M.J. et al. "Applying DMOSTs, Diodes and Thyristors Above and Below Substrate in Thin-Layer SOI", Proc. IEEE Int. Symp. on Power Sem. Dev., pp. 232-235 (Apr. 2003).

Letavic, L. et al. "600V Power Conversion System-on-a-chip Based on Thin Layer Silicon-on Insulator", Proc. IEEE Int. Symp. on Power Sem. Dev. and IC's s, pp. 325-328 (1999).

Gentry, F.E. et al. "The Amplifying Gate Thyristor", IEEE Int. Electroc Device Meet, p. 110 (1968).

Extended European Search Report for EP Patent Appln. No. 13173359.4 (dated Nov. 26, 2013).

\* cited by examiner

THYRISTOR, A METHOD OF TRIGGERING A THYRISTOR, AND THYRISTOR CIRCUITS

CROSS-REFERENCE TO RELATED APPLICATIONS

This application claims the priority under 35 U.S.C. §119 of European patent application no. 13173359.4, filed on Jun. 24, 2013, the contents of which are incorporated by reference herein.

FIELD OF THE INVENTION

This invention relates to thyristors, methods of triggering thyristors and to thyristor circuits.

BACKGROUND OF THE INVENTION

Thyristors are bi-stable elements, consisting of two interacting PNP and NPN bipolar transistors configured in a PNPN arrangement, that can be triggered from an off-state into a very low ohmic on-state. Conventionally, a positive current is applied to the base of the NPN transistor in order to trigger the device.

For some applications, particularly those in which the thyristor operates at high positive voltages, it is desirable to be able to trigger the thyristor by using a negative current. It is known to trigger a thyristor by providing a negative current to the base of the PNP transistor. It is also known to trigger a thyristor by providing a negative current to the emitter of the NPN transistor.

Devices configured for such known negative current triggering methods may suffer from one or more disadvantages such as non-stable breakdown voltages which vary across typical manufacturing process spreads, excessive trigger currents, and increased voltage drop resulting in increased dissipation in the on state.

SUMMARY

According to an aspect there is provided a thyristor comprising: a first region of a first conductivity type; a second region of a second conductivity type and adjoining the first region; a third region of the first conductivity type and adjoining the second region; a fourth region of the second conductivity type and comprising a first segment and a second segment separate from the first segment, the first segment and second segment each adjoining the third region; a first contact adjoining the first region; a second contact adjoining the first segment; and a trigger contact adjoining the second segment and separate from the second contact.

Thus, according to this aspect, a trigger current may be provided to the second segment of the fourth region, but may not require to pass through the first segment of the fourth region. It may thus be possible to separately design or control the impedance of the main current carrying path, which includes the first segment of the fourth region, to be independent of, or to have a relatively reduced dependence on, the triggering contact and the requirements of the trigger current. By providing the second segment separate from the first segment, the segments may be differently electrically biased. Thus the first and second segments will generally be electrically separate and in particular will have a degree or level of electrical isolation therebetween. They may be widely physically spaced apart, or otherwise electrically isolated, for instance by junction isolation.

The thyristor comprises a resistive element electrically connecting the first segment and the third region. The resistor may connect the third region to ground. The resistor acts to prevent the third region from floating, since otherwise, it may simply move down in voltage along with the first segment. It generally acts to maintain the bias close to the second segment and supply the necessary base current. It may be integral with the rest of the device, or may be provided as a separately connected component.

In embodiments, the first segment and the second segment are each enclosed by the fourth region. Thus the segments may be electrically separated by means of being spaced apart in the fourth region. For example, they may be physically and/or electrically separate regions in an n-well.

In embodiments, the thyristor comprises a diode electrically in parallel with the resistive element and connected between the second segment and the third region. Such a diode may have the effect of limiting the negative voltage achievable by the third region. Such a diode may be integral with the rest of the device, or may be provided as a separately connected component.

In embodiments, the first conductivity type is p-type and the second conductivity type is n-type. In embodiments, the first electrical contact is an anode and the second contact is a cathode.

In embodiments, the second region is a first base region and the third region is a second base region, the first base region comprises a relatively lightly doped drift region, the second base region is relatively heavily doped, and the first region has a length which is greater than that of the second base region.

According to another aspect, there is provided a driver comprising a thyristor as just described and a controller configured to provide a negative trigger current to the trigger contact of the thyristor.

According to a yet further aspect, there is provided an LED lighting circuit, comprising such a driver and a plurality of LED strings, with a switched LED string arranged in parallel with the thyristor, the thyristor being configured to, in use, provide a bypass circuit for the switched LED string.

According to another aspect, there is provided a method of operating a thyristor having a first region adjacent an anode, second and third regions being first and second base regions respectively, and a fourth region adjacent a cathode and comprising separate first and second segments, the method comprising: triggering the thyristor by drawing a negative current from a trigger contact in electrical connection with the second segment, and switching off the thyristor by stopping drawing the negative current.

In embodiments, the method further comprises switching off the thyristor by electrically connecting the second segment to the third region. Thus, by shorting the second segment with the third region, which in a typical application may correspond to shorting a resistor between these two regions, the device may switched off.

These and other aspects of the invention will be apparent from, and elucidated with reference to, the embodiments described hereinafter.

BRIEF DESCRIPTION OF DRAWINGS

Embodiments of the invention will be described, by way of example only, with reference to the drawings, in which.

Figure 1:
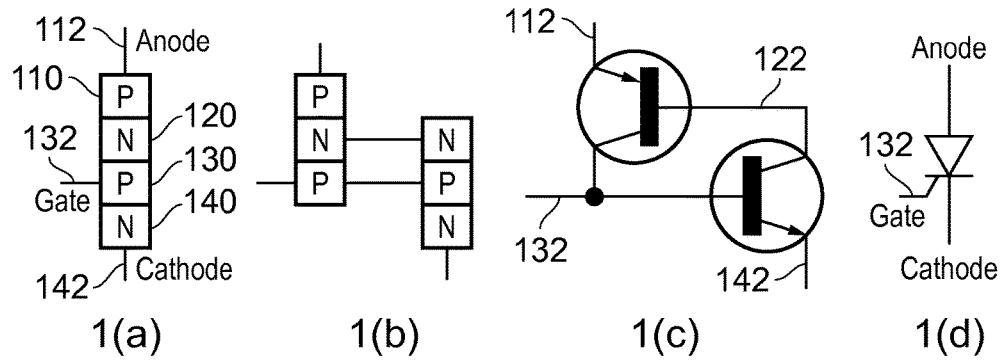
FIG. 1 illustrates a generic thyristor depicted in several different forms.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar features in modified and different embodiments.

DETAILED DESCRIPTION OF EMBODIMENTS

FIG. 1 shows a generic thyristor depicted in several different ways. A thyristor is a PNPN device, and as shown at FIG. 1(a) comprises four regions 110, 120, 130, and 140, which are doped to have p, n, p and n conductivity respectively. Conventionally region 110 is called the first emitter, regions 120 and 130 are known as first and second base regions respectively, and region 140 is described as the second emitter region. The first emitter 110 is adjacent to an anode contact 112, and the second emitter 140 is adjacent to a cathode contact 142. A thyristor has a gate, or trigger, contact 132, which for conventional positively triggered thyristors typically is connected to the second base region 130.

As can be seen from FIG. 1(b), it is possible to consider a thyristor as a pair of two interacting PNP and NPN bipolar transistors. The first, PNP, transistor comprises regions 110, 120 and 130 acting as emitter, base and collector respectively, whilst the second, NPN, transistor comprises regions 120, 130 and 140 acting as collector, base and emitter respectively. FIG. 1(c) shows a thyristor as a combination of two bipolar transistors as just described, depicted by the conventional circuit signal for the bipolar transistors, and FIG. 1(d) shows the same device using the conventional circuit symbol for a thyristor. It may be observed that the gate contact 132 appears as an external contact, whereas the interconnection 122 between the collector of the second transistor and the base of the first transistor is not shown as an external contact to the device.

Figure 2:
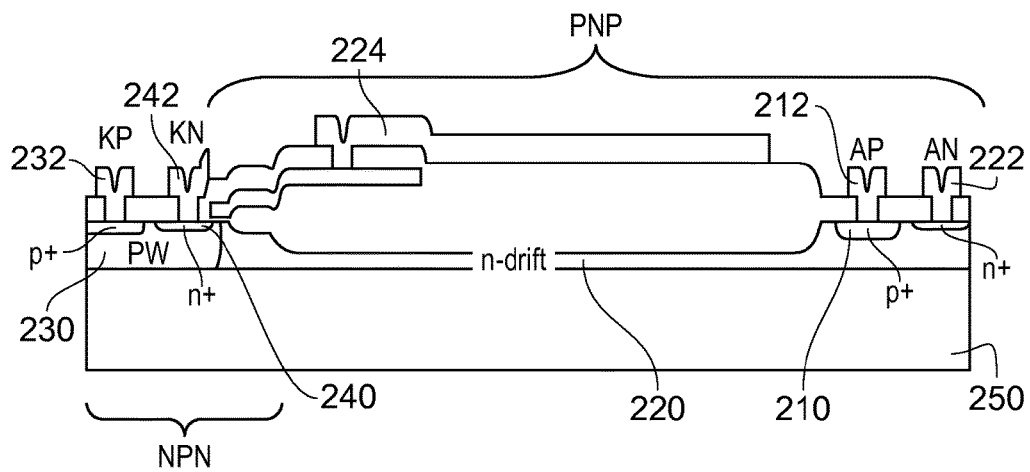
FIG. 2 shows a schematic cross-section through a conventional thyristor device.
Figure 3:
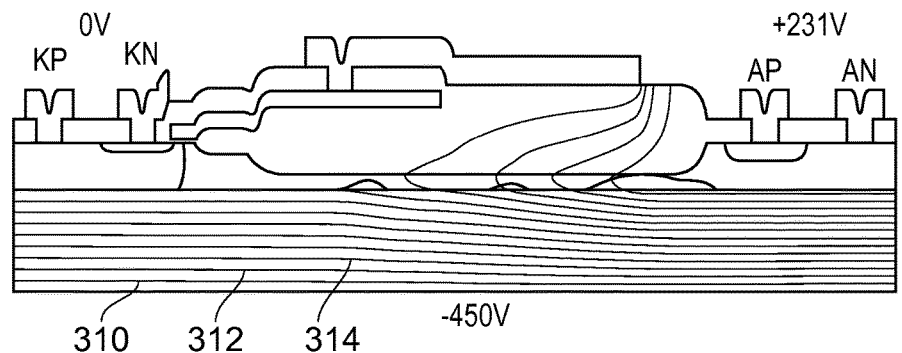
FIG. 3 shows lines of the equipotential curves in a conventional thyristor device as depicted in FIG. 2.

FIG. 2 shows a schematic cross-section through a conventional thyristor device. FIG. 3 shows the electrical fields across the same device in its off-state and close to breakdown. The first and second emitter regions are shown as 210 and 240 respectively, and the first and second base regions are shown at 220 and 230 respectively. Contacts are provided to each of these regions at 212, 222, 232, and 242 respectively. Also shown is a field plate 224. Structurally, the device is similar to standard high-voltage NDMOS devices, with an extended, very low-doped n− drift region forming the base of the pnp transistor. A high degree of electrical isolation is provided by the oxide structure 250 beneath the active device; the n− drift region provides electrical isolation across the PNP transistor. In contrast with the length of the base region of the PNP transistor which includes the n− draft region, the base region of the NPN transistor is provided by a relatively narrow body diffusion region 230. Typically the length of this region may be less than 1 µm whilst the length of the n-drift region is typically 40 to 60 µm.

FIG. 3 shows the same structure, with lines of equipotential, 310, 312, 314 etc superimposed thereon. The conditions shown correspond to 450V highside at a 231V anode-cathode bias, that is, there is a total of 681V across the device.

Figure 4:
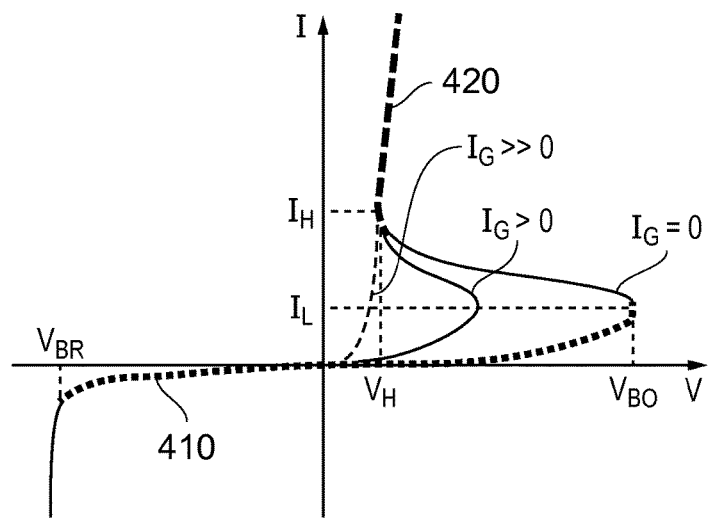
FIG. 4 shows current-voltage characteristic curves of the thyristor in an on state and in an off state.

FIG. 4 shows a current voltage characteristic of a thyristor in a nonconducting state (bold dotted line 410), and a conducting state (bold dashed line 420). In non-conducting state the thyristor exhibits a very high resistance (very shallow IV curve) between its reverse breakdown voltage $V_{BR}$ and a forward breakdown voltage $V_{BO}$. In its conducting state the thyristor exhibits a very low resistance (a very steep IV curve) in forward bias (that is to say, the first quadrant). The nonconducting state corresponds to a gate or trigger current $I_G$. The figure shows the transition as $I_G$ is increased from 0 ($I_G=0$) to a high current ($I_G>>0$). Triggering is typically effected by forcing a positive base current $I_G$ into the NPN transistor (at the gate node).

Figure 5:
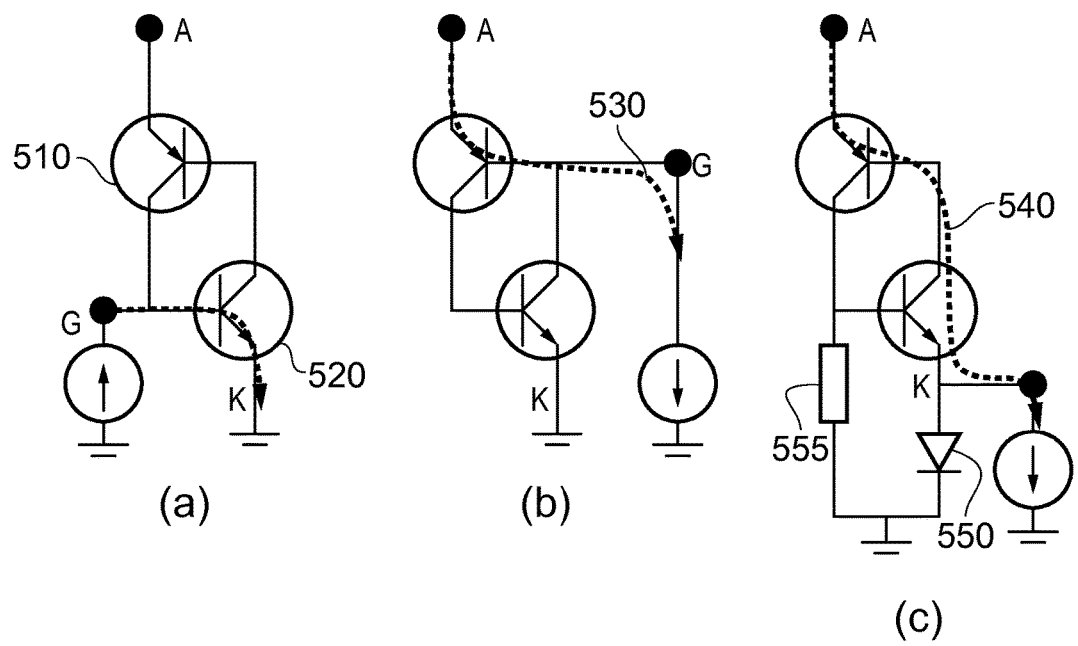
FIG. 5 shows conventional arrangements for triggering a thyristor, at FIG. 5(a) by a positive current and at FIGS. 5(b) and 5(c) by negative trigger currents.

FIG. 5 shows known methods for triggering a thyristor, the thyristor being shown as a pair of interconnected PNP and NPN transistors 510 and 520. Triggering by means of forcing the positive base current $I_G$ into the NPN transistor at the gate node is shown in FIG. 5(a). The triggering current is shown in bold dotted line 530.

In some applications, examples of which will be described in more detail hereinunder, it may be preferable to trigger the thyristor using a negative current rather than a positive current. Two known mechanisms for such triggering are shown in FIGS. 5(b) and 5(c) respectively.

FIG. 5(b) depicts so-called PNP triggering. In this triggering method, a negative current is drawn from the base of the PNP resistor. So in this structure, the gate contact of the thyristor is connected to the base of the PNP transistor. This structure suffers from the fact that the PNP is generally a very poor bipolar due to its very wide base region. As a result, only a very small fraction of the trigger current results in holes that reach the cathode. Since these holes are needed to switch on the NPN, the device may be difficult to trigger, particularly at low-side conditions—that is to say, when there is not a large voltage across the device. Typically, the amount of holes may be so low that a floating body is needed to get the device to trigger at all at low side conditions. Floating bodies however are notorious for resulting in unexpected and non-reproducible behaviour. Nonetheless, this may result in high trigger currents at low-side conditions.

FIG. 5(c) depicts emitter triggering. In this configuration the NPN base-emitter junction is brought into forward bias by drawing a (trigger) current 540 (shown as a bold dotted line) from the cathode. This structure requires at least two additional components: (1) an additional diode 550 to allow the cathode to be pulled to a negative bias and (2) a resistor 555 connected to the base to provide the necessary base current. Using the full cathode as a trigger emitter again results in high trigger currents. Further, the added diode in the main current path results in an additional ~0.7V voltage drop across the circuit. This additional voltage significantly increases the dissipation.

Figure 6:
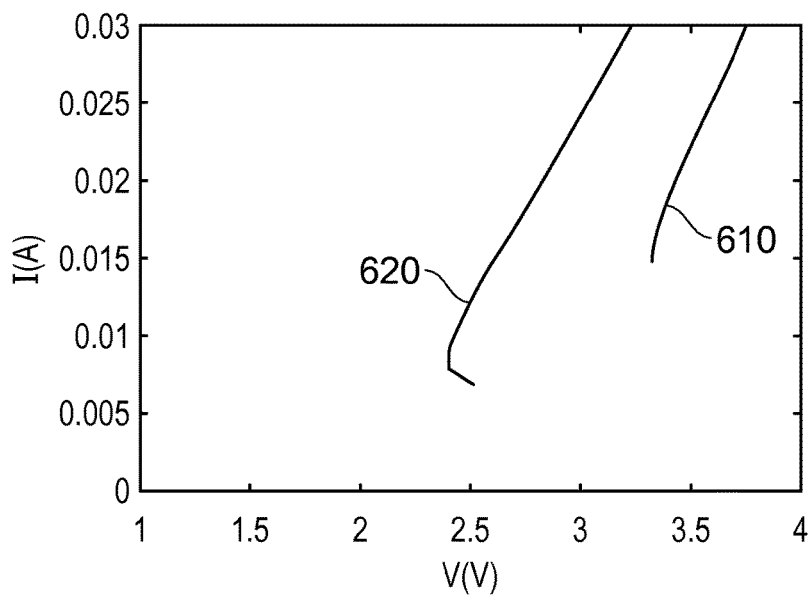
FIG. 6 shows example on-state dissipation curves for a conventional thyristor and a thyristor according to embodiments.

This dissipation is shown pictorially in FIG. 6. FIG. 6 shows the measured on-state anode hold current (on the ordinate or Y-axis) for a 300 µm wide emitter triggered thyristor, against voltage Vak (on the abscissa or x-axis), at 610 according to conventional emitter-triggered structure and at 620 according to embodiments as will be described below. The typical voltage drop in a conventional emitter-triggered device is greater than 3V, due to the extra 0.7V voltage drop in the added diode. The design according to embodiments, having a separate trigger gate as will be described in more detail hereinunder, shows a significantly lower voltage drop as well as a lower hold current.

Figure 7A:
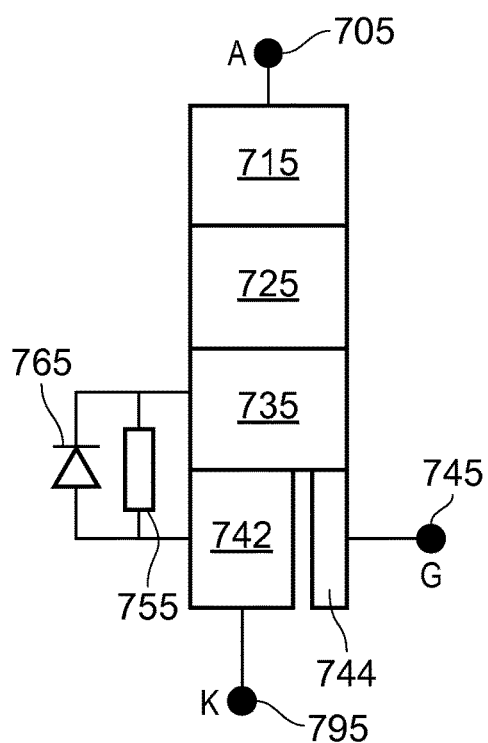
FIG. 7 shows a thyristor according to embodiments, at FIG. 7(a) in block form and at FIG. 7(b) in circuit diagram form.

In embodiments, the n+ emitter in the NPN is split up into at least two segments, or regions, that are routed to two different bondpads. Typically the larger emitter will act as the original cathode whereas the smaller emitter now becomes the gate. The segments or regions are generally spaced-apart, in order that they can be separately electrically biased at different biases. In a typical physical configuration, this electrical isolation may be achieved by separately locating the segments, with sufficient spacing between them, in a pwell. The structure is shown schematically in FIG. 7(a). The figure shows a thyristor, which may typically be a PNPN structure, with four regions. Three of these regions, being the first emitter 715 connected to an anode contact 705 and first and second base regions 725 and 735, are—at least generally—unchanged compared with a conventional thyristor structure (110, 120 and 130 respectively). However the fourth region is split into two separate regions 742 and 744. The first region or segment 742 acts as the conventional emitter and is connected to a cathode contact 795; the second region or segment 744 acts as the gate, and is electrically connected to a trigger or gate contact 745.

Figure 7B:
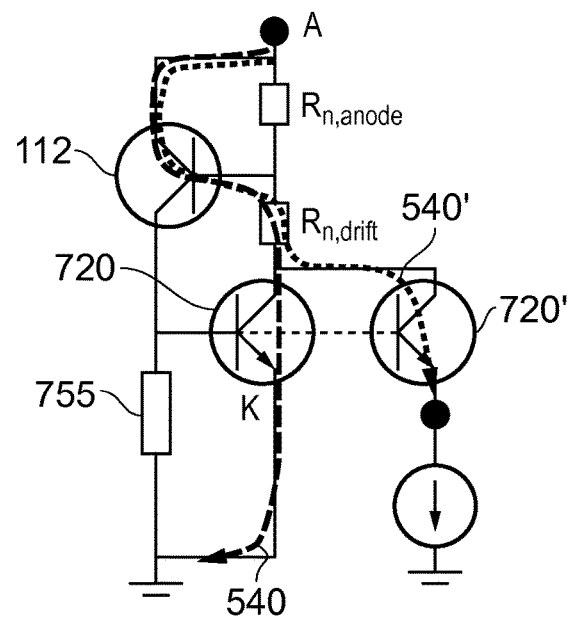

In terms of circuit implementation, an equivalent circuit according to embodiments is shown in FIG. 7(b). Effectively, the segmented emitter splits up the original NPN 520 into two parallel NPNs 720 and 720', the first one carrying the main current (bold dashed line 540) whereas the second is solely for triggering and only takes the triggering current (bold dotted line 540'). A resistance Rn,anode is shown, between regions 715 and 725. Such a resistance may ensure that the bases is not floating. A further resistance Rn,drift, is shown, in a simplified schematic way, between the regions 725 and 735. This represents the resistance of the—relatively long—drift region.

In embodiments, the base of the NPN transistor is connected to ground by a resistor 755. A relatively high resistance value, which may in practice be between about 100 Ohms and several hundred kOhms, may generally be used in order to achieve a particularly low hold current. If this resistance is too low the hold current may become too high, which is generally not desirable. Conversely, if the resistance is too high—and in particular if it is open circuit—the device could become semi-floating, which may result, as the skilled person will appreciate, in problems with voltage spike and dV/dt. Further, using a too high resistance may result in the body being pulled down to excessive negative bias during triggering, which may not be desirable.

Figure 8:
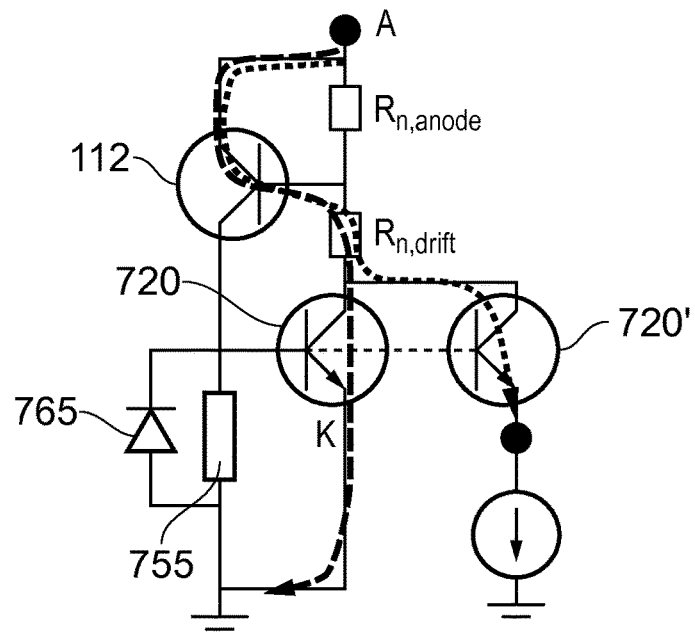
FIG. 8 shows a thyristor according to other embodiments in circuit diagram form.

In some embodiments, such as that shown in FIG. 8, a parallel diode 765 is included in parallel with the cathode-base resistor. This may provide a more robust integration, and in particular may limit the base voltage to approximately −0.7V without affecting the hold currents. In other respects the embodiment shown in FIG. 8 is similar to that shown in FIG. 7(b).

Figure 9:
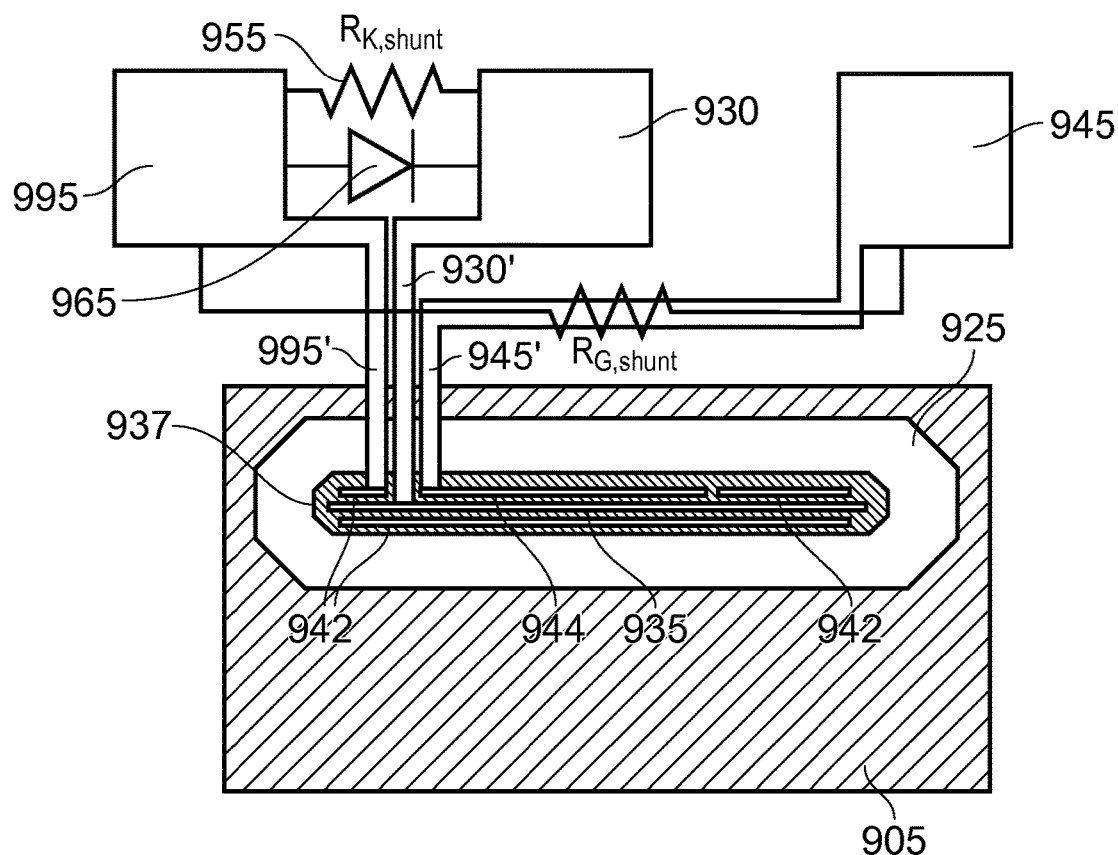
FIG. 9 shows a partially stripped away plan view of a thyristor according to embodiments.

An example partially stripped away plan view of a thyristor structure according to embodiments is shown in FIG. 9. This view shows the conventional large area bond pad 905 for the anode, and a conventional bond pad 995 for the cathode. The cathode bond pad 995 is connected, by means of track 995' which may typically be a metal track, to segments 942 of the emitter. Although as shown in FIG. 9, the segments are discontinuous, in practice, they are connected by means of a metal connection. The emitter segments, or sections, 942 are enclosed in a PWELL region 937 that is connected by a p+ body contact region 935. The PWELL region 937 thus corresponds to PW in FIG. 2—that is to say, the second base region 230. p+ body contact region 935 may be connected to a contact pad 930 by means of track 930' which may typically be a metal track. Contact pad 930 may be an external contact pad, or may be used internally within a device. Contact pad 930 thus corresponds to the KP contact 232 in FIG. 2. In particular, a resistive element $R_{k,shunt}$ 955 may connect base contact pad 932 to cathode bond pad 995. The resistive element 955 may be provided as a separate component, or may be the result of parasitics. The resistive element 955 may have a value of several hundred Ohms. In addition, a diode 965 may be connected between the base contact pad 930 and the cathode bond pad 995. The diode 965 may be provided as an integrated diode. In the case that both diode 965 and resistive element 955 are provided as integrated components, there may not be any requirement to contact base contact pad 930, in which case this pad may be omitted.

Also surrounded by the PWELL region 937, in addition to emitter segment or segments 942 connected to cathode bond pad 995, is a separate emitter segment 944. Emitter segment 944 is spaced apart from the emitter segment 942, such that, in general, it will be electrically isolated therefrom. Emitter segment 944 is connected, by means of track 945' which may be a metal track, to trigger contact pad 945. Trigger contact pad 945 may be connected to cathode bond pad 995 by a resistive element $R_{G,shunt}$. The resistive element $R_{G,shunt}$ may be a separate component or may be formed from parasitics.

In the embodiments shown in FIG. 9, the emitter is separated into just two segments 942 and 944. In other embodiments, the emitter may include further segments. One or more of these further segments may be connected by a metal track to the cathode contact pad 995; in other embodiments separate contact pads may be provided for two or more of the emitter segments. Thus in embodiments, there may be provided two or more trigger contact pads 945. In particular, in the case of a very high current thyristor, it may be appropriate or convenient to simply replicate the two segments 942 and 944. This may enhance uniform triggering to the on-state, across the complete device. Thus in a high current device, there may be two or more associated trigger contact pads. It should be noted that FIG. 9 is schematic only, and the relative spacing and dimensions of the regions of FIG. 9 have been adjusted to aid understanding. In particular, in an illustrative embodiment the added body region may be much more tightly wrapped around the emitter areas 942 and 944 than shown, and the second base width (that is, the distance between regions 942 and 944 to the edge of the body implant) may be much smaller than the first base width—that is, the distance from region 935 to regions 942 and 944.

Without limitations, thyristors according to embodiments may be convenient for use in high-voltage applications. Thyristors are convenient for very high current applications, due to their relatively low on-state resistance. Typical applications may be high-voltage DC applications handling currents of several hundreds of amperes and up to or above 1 kV. However, thyristor applications are not limited to such high currents. An example lower current application is a LED lighting circuit, which may typically operate at or below 1A. Thus Thyristors according to embodiments may operate particular effectively under so-called highside conditions for power switching, where it may be desirable to drive the thyristor by a negative trigger current. An example of such an application is a multi-output LED driver circuit, such as that shown in FIG. 10. An early example of such an embodiment, under development by NXP Semiconductors B.V., may be usable to drive 120 mA at a breakdown voltage of 650V.

Figure 10:
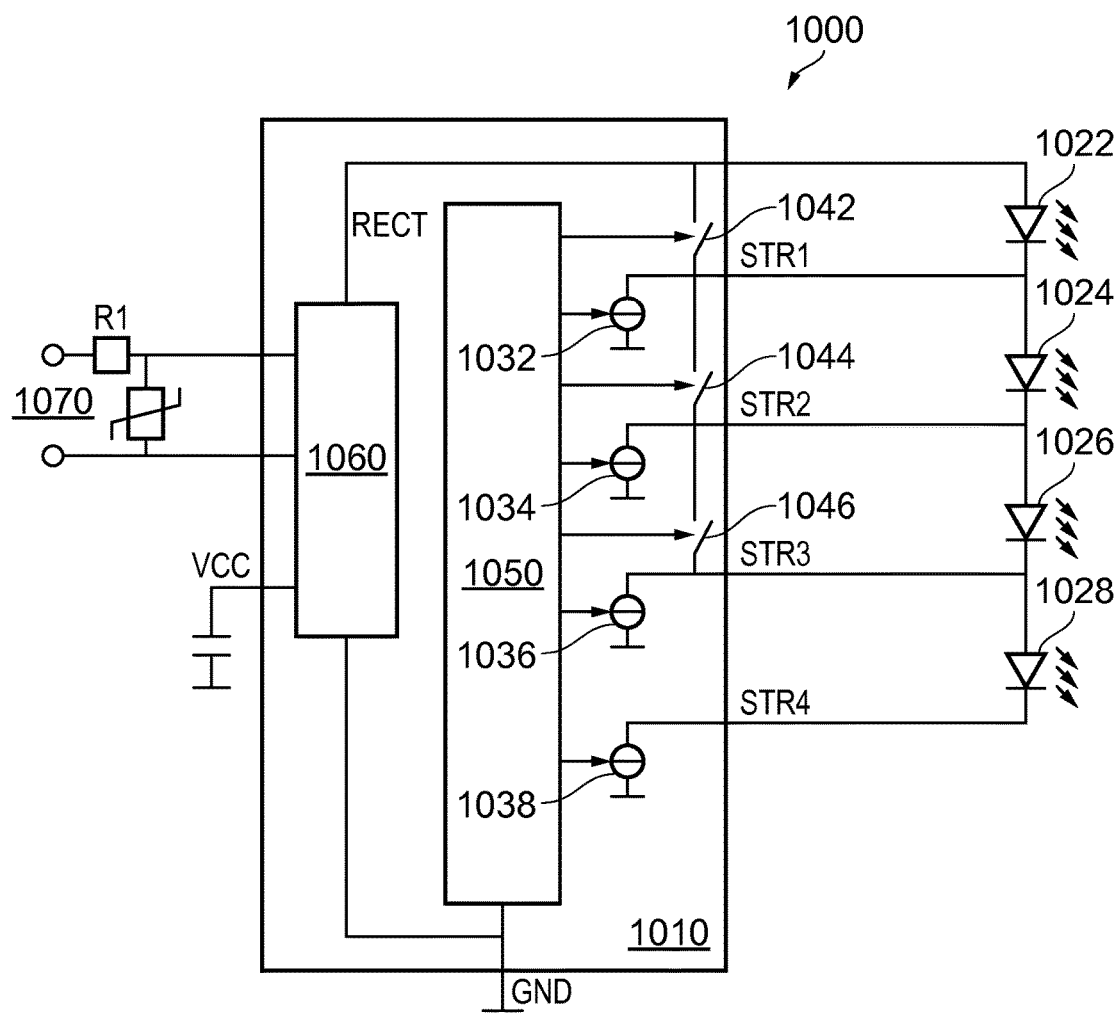
FIG. 10 shows an example application according to embodiments.

FIG. 10 shows an LED lighting circuit 1000 comprising a system driver 1010 for driving a plurality of LED strings 1022, 1024, 1026 and 1028. The strings are arranged in a "direct to mains" configuration, such that they are connected and disconnected in sequence, in response to the instantaneous mains voltage. As shown, the LED strings are arranged in series. The system driver 1010 includes current sources 1032, 1034, 1036, and 1038, for providing string currents STR1 . . . STR4 as shown. However the system driver 1010 also includes three thyristors 1042, 1044 and 1046 as shown. The thyristors are arranged so as to be able to short-circuit individual ones of the LED strings, respectively 1022, 1024 and 1026.

The current sources and the thyristors are controlled by a controller 1050. The system controller also includes a high-voltage supply unit 1064 providing a rectified power supply, from the mains 1070.

As a simplified example of operation, consider the case that the LED strings each require a voltage of 60V to operate, and the lighting circuit is connected to a 230V 50 Hz mains supply with peak voltage of 325V. At a zero crossing of the mains supply, none of the strings are operational. After about 5 ms the mains voltage reaches approximately 60V, and then the first LED string 1028 is connected. At this point, it is required to short, or bypass, the remaining three LED strings, which is done by means of closing the thyristors 1042, 1044 and 1046. After about 12 ms, the mains voltage reaches approximately 120V, at which point thyristor 146 is opened, such that LED string to 1026 is no longer bypassed, and is switched on. Once the mains voltage reaches 180V, the thyristor 1044 bypassing the LED string 1024 is switched off to remove that short, and finally once the mains voltage reaches 240V, the thyristor 1042 bypassing the LED string 1022 is opened. All LED strings are now operational, and continue to operate during the highest voltage part of the main cycle. As the voltage starts to fall, the thyristors are closed, in the opposite sequence—that is to say 1042, 1044 and then 1046, in order to sequentially bypass increasing numbers of the strings.

Such application is a—non-limiting—example of a relatively high current application, in which the thyristors operate on the highside, and benefit from a negative trigger current.

From reading the present disclosure, other variations and modifications will be apparent to the skilled person. Such variations and modifications may involve equivalent and other features which are already known in the art of thyristors, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfill the functions of several means recited in the claims and reference signs in the claims shall not be construed as limiting the scope of the claims.

The invention claimed is:
1. A thyristor, comprising:
a first region of a first conductivity type, wherein the first region is designated as the anode of the thyristor;
a second region of a second conductivity type and adjoining the first region;
a third region of the first conductivity type and adjoining the second region, wherein the third region comprises a well structure;
a first segment of the second conductivity type, the first segment adjoining the third region and residing in the well structure, wherein the first segment is designated as the cathode of the thyristor;
a second segment of the second conductivity type and that is separate from the first segment, the second segment adjoining the third region and residing in the well structure, wherein the first and second segments both reside in the same well structure, and wherein the second segment is designated as the gate of the thyristor;
a resistive element electrically connecting the first segment and the third region;
a diode electrically in parallel with the resistive element and being connected to both the first segment and to the third region, wherein a cathode of the diode is not directly connected to the gate of the thyristor;
a first contact adjoining the first region;
a second contact adjoining the first segment; and
a trigger contact adjoining the second segment and separate from the second contact.
2. The thyristor of claim 1, wherein the third region is a single contiguous region.
3. The thyristor of claim 1, wherein the anode of the diode is directly connected to the first segment, and the cathode of the diode is directly connected to the third region.
4. The thyristor of claim 1, wherein the first conductivity type is p-type and the second conductivity type is n-type.
5. The thyristor of claim 1, wherein the first contact is an anode and the second contact is a cathode.
6. The thyristor of claim 5, wherein the second region is a first base region and the third region is a second base region, the first base region comprises a drift region, and the first region has a length greater than a length of the second base region.

7. A driver comprising the thyristor of 1 and a controller configured to provide a negative trigger current to the trigger contact of the thyristor.

8. An LED lighting circuit, comprising the driver of claim 7 and a plurality of LED strings, with a switched LED string arranged in parallel with the thyristor, the thyristor being configured to provide a bypass circuit for the switched LED string.

9. A method of operating the thyristor of claim 1, the method comprising:
triggering the thyristor by drawing a negative current from the trigger contact in electrical connection with the second segment.

10. The method of claim 9, further comprising switching off the thyristor by electrically connecting the second segment to the third region.

11. The thyristor of claim 6, wherein the drift region has a doping concentration less than a doping concentration of the third region.

12. The thyristor of claim 1, wherein the resistive element electrically connects the third region to ground.

13. The thyristor of claim 1, further comprising a plurality of first segments, a plurality of second segments, and a plurality of trigger contacts.

* * * * *